(12) United States Patent
Liang et al.

(10) Patent No.: US 10,240,232 B2
(45) Date of Patent: Mar. 26, 2019

(54) GAS CONTROL IN PROCESS CHAMBER

(71) Applicant: Applied Materials, Inc., Santa Clara, CA (US)

(72) Inventors: Qiwei Liang, Fremont, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 310 days.

(21) Appl. No.: 15/184,670

(22) Filed: Jun. 16, 2016

(65) Prior Publication Data
US 2016/0369395 A1 Dec. 22, 2016

Related U.S. Application Data

(60) Provisional application No. 62/180,858, filed on Jun. 17, 2015.

(51) Int. Cl.
C23C 16/455 (2006.01)
C23C 16/44 (2006.01)

(52) U.S. Cl.
CPC .... C23C 16/4412 (2013.01); C23C 16/45563 (2013.01); C23C 16/45574 (2013.01)

(58) Field of Classification Search
USPC .......... 118/715, 723 E; 156/345.33, 156/345.43–345.45
See application file for complete search history.

(56) References Cited

U.S. PATENT DOCUMENTS 4,579,618 A * 4/1986 Celestino ............... H01J 37/32
156/345.34
4,590,042 A * 5/1986 Drage ................. H01J 37/3244
156/345.34
5,851,294 A * 12/1998 Young ............... C23C 16/45508
118/715

(Continued)

FOREIGN PATENT DOCUMENTS

JP          11026190 A  *  1/1999
JP       2001-118789 A     4/2001

(Continued)

OTHER PUBLICATIONS

Search Report dated Aug. 19, 2016 for Application No. PCT/US2016/035337.

Primary Examiner — Rudy Zervigon
(74) Attorney, Agent, or Firm — Patterson + Sheridan, LLP

(57) ABSTRACT

A process chamber is provided including a sidewall, a substrate support, and an exhaust vent disposed above the substrate support. A processing region is formed between the exhaust vent and substrate support, and the exhaust vent is coupled to an exhaust device configured to create a low pressure at the exhaust vent relative to the processing region. The process chamber further includes a gas ring including an annular shaped body having an inner surface that circumscribes an annular region. The gas ring further includes a plurality of first nozzles that are coupled to a first gas source and configured to deliver a first gas to the processing region. The gas ring further includes a plurality of second nozzles that are coupled to a second gas source and configured to deliver a second gas to the processing region.

17 Claims, 14 Drawing Sheets

(56) References Cited

U.S. PATENT DOCUMENTS

| | | | |
|---|---|---|---|
| 5,885,358 A * | 3/1999 | Maydan | C23C 16/455 118/715 |
| 6,070,550 A * | 6/2000 | Ravi | C23C 16/401 118/723 E |
| 6,070,551 A * | 6/2000 | Li | C23C 16/401 118/715 |
| 6,820,570 B2 | 11/2004 | Kilpela et al. | |
| 7,252,716 B2 * | 8/2007 | Kim | C23C 16/4558 118/715 |
| 7,435,445 B2 | 10/2008 | Shin et al. | |
| 7,547,465 B2 | 6/2009 | Chang et al. | |
| 7,601,223 B2 * | 10/2009 | Lindfors | C23C 16/4412 118/715 |
| 7,651,955 B2 | 6/2010 | Ranish et al. | |
| 8,043,981 B2 | 10/2011 | Ma et al. | |
| 8,328,939 B2 | 12/2012 | Choi et al. | |
| 8,501,599 B2 * | 8/2013 | Ueno | C23C 16/46 118/724 |
| 8,795,793 B2 | 8/2014 | Choi et al. | |
| 8,869,742 B2 * | 10/2014 | Dhindsa | C23C 16/4412 118/723 E |
| 9,184,028 B2 * | 11/2015 | Dhindsa | H01J 37/32091 |
| 9,941,100 B2 * | 4/2018 | Wu | C23C 16/52 |
| 9,976,215 B2 * | 5/2018 | Chou | C23C 16/45565 |
| 9,982,340 B2 * | 5/2018 | Lee | H01J 37/32091 |
| 2004/0052972 A1 * | 3/2004 | Schmitt | C23C 16/4412 427/569 |
| 2004/0216665 A1 * | 11/2004 | Soininen | C23C 16/4412 118/715 |
| 2004/0216668 A1 * | 11/2004 | Lindfors | C23C 16/4412 118/715 |
| 2004/0238649 A1 * | 12/2004 | Ohminami | C23C 16/46 236/1 C |
| 2005/0211264 A1 * | 9/2005 | Kostenko | B08B 7/0035 134/1.1 |
| 2006/0096540 A1 * | 5/2006 | Choi | C23C 16/45574 118/724 |
| 2006/0112876 A1 * | 6/2006 | Choi | C23C 16/45563 118/715 |
| 2006/0196417 A1 * | 9/2006 | Lin | C23C 16/45574 118/715 |
| 2006/0196420 A1 * | 9/2006 | Ushakov | C23C 16/45563 118/715 |
| 2007/0163440 A1 | 7/2007 | Kim et al. | |
| 2007/0277734 A1 * | 12/2007 | Lubomirsky | C23C 16/402 118/715 |
| 2007/0281106 A1 * | 12/2007 | Lubomirsky | C23C 16/401 427/569 |
| 2008/0182345 A1 * | 7/2008 | Sugishita | H01L 22/20 438/7 |
| 2009/0029486 A1 * | 1/2009 | Ueno | C23C 16/46 438/5 |
| 2009/0068823 A1 | 3/2009 | Hong | |
| 2010/0183825 A1 * | 7/2010 | Becker | C23C 16/4404 427/569 |
| 2012/0034786 A1 * | 2/2012 | Dhindsa | C23C 16/4412 438/710 |
| 2012/0141676 A1 * | 6/2012 | Sershen | C23C 16/45551 427/255.23 |
| 2012/0258555 A1 * | 10/2012 | Holland | H01J 37/32596 438/5 |
| 2013/0087093 A1 | 4/2013 | Olgado et al. | |
| 2014/0097270 A1 | 4/2014 | Liang et al. | |
| 2014/0261168 A1 | 9/2014 | Liang et al. | |
| 2014/0273487 A1 | 9/2014 | Deshmukh et al. | |
| 2016/0369395 A1 * | 12/2016 | Liang | C23C 16/4412 |

FOREIGN PATENT DOCUMENTS

| | | |
|---|---|---|
| JP | 2005302848 A * | 10/2005 |
| JP | 2010-118462 A | 5/2010 |
| JP | 2014-033056 A | 2/2014 |
| KR | 1020030033914 | 5/2003 |
| KR | 10-2013-0054708 | 5/2013 |

\* cited by examiner

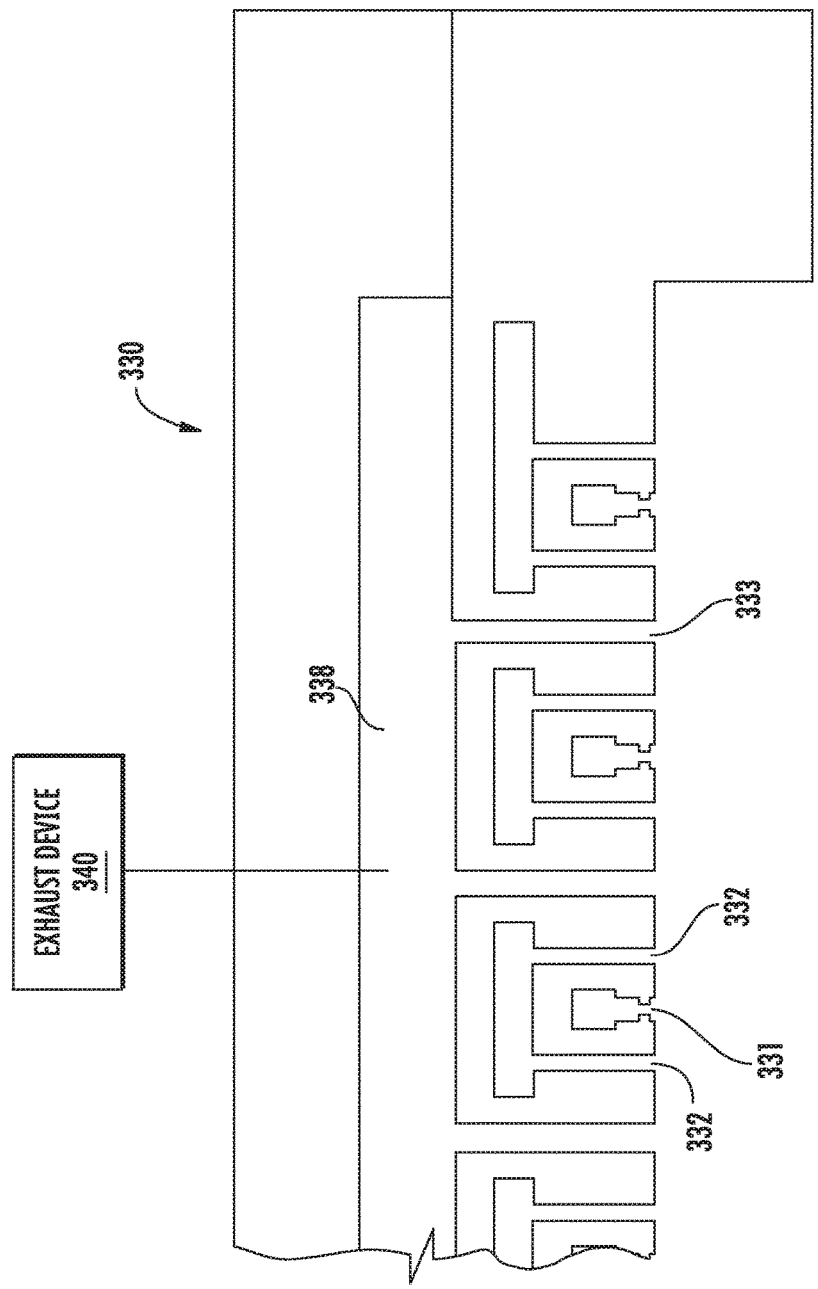

GAS CONTROL IN PROCESS CHAMBER

CROSS-REFERENCE TO RELATED APPLICATIONS

This application claims priority to U.S. Provisional Patent Application Ser. No. 62/180,858, filed on Jun. 17, 2015, which herein is incorporated by reference.

BACKGROUND

Field of the Disclosure

Embodiments described herein generally relate to a semiconductor process chamber. More specifically, embodiments of the disclosure relate to a semiconductor process chamber adapted to control the flow and concentration of gases over the surface of the substrate.

Description of the Related Art

In the fabrication of integrated circuits, deposition processes such as chemical vapor deposition (CVD) or plasma enhanced CVD processes, are used to deposit films of various materials upon semiconductor substrates. These deposition processes may take place in an enclosed process chamber. The dimensions of features on semiconductor substrates continue to shrink to meet the demands of modern electronics. Further reductions for these dimensions will require precise control over different aspects of the deposition processes, such as gas distribution uniformity, gas mixing uniformity, concentration uniformity and control of the amount of gases provided to the surface of the substrate. Thus, there is a continuing need for an improved process chamber to further enhance the control over different aspects of these deposition processes.

SUMMARY

Embodiments disclosed herein generally relate to a semiconductor process chamber. In one embodiment, a process chamber is provided including a sidewall, a substrate support, and an exhaust vent disposed above the substrate support. A processing region is formed between the exhaust vent and the substrate support, and the exhaust vent is coupled to an exhaust device configured to create a low pressure at the exhaust vent relative to the processing region. The process chamber further includes a gas ring including an annular shaped body having an inner surface that circumscribes an annular region. The gas ring further includes a plurality of first nozzles that are coupled to a first gas source and configured to deliver a first gas to the processing region. The plurality of first nozzles are formed in the annular shaped body in a first circular array. The gas ring further includes a plurality of second nozzles that are coupled to a second gas source and configured to deliver a second gas to the processing region. The plurality of second nozzles are formed in the annular shaped body in a second circular array.

In another embodiment, a process chamber is provided including a sidewall and a substrate support. The substrate support includes a plurality of substrate holders disposed at different angular locations around the substrate support. The substrate support is rotatable around an interior of the process chamber. The process chamber further includes an exhaust vent disposed above each substrate holder. A processing region is formed between each exhaust vent and the substrate support, and each exhaust vent is coupled to an exhaust device configured to create a low pressure at the exhaust vent relative to the processing region. The process chamber further includes a gas ring including an annular shaped body having an inner surface that circumscribes an annular region. The gas ring includes a plurality of first nozzles that are coupled to a first gas source and configured to deliver a first gas to the processing region, wherein the plurality of first nozzles are formed in the annular shaped body in a first circular array. The gas ring further includes a plurality of second nozzles that are coupled to a second gas source and configured to deliver a second gas to the processing region, wherein the plurality of second nozzles are formed in the annular shaped body in a second circular array.

In another embodiment, a process chamber is provided including a sidewall and a substrate support. The substrate support includes a plurality of substrate holders disposed at different angular locations around the substrate support. The substrate support is rotatable around an interior of the process chamber. The process chamber further includes a showerhead disposed above each substrate holder, wherein a processing region is formed between each showerhead and the substrate support. Each showerhead includes a plurality of first orifices coupled to a first gas source. Each showerhead further includes a plurality of second orifices coupled to a second gas source, where four or more second orifices are disposed around each first orifice. Each showerhead further includes a plurality of third orifices coupled to an exhaust device configured create a low pressure at the plurality of third orifices relative to the processing region, where four or more second orifices are disposed around each third orifice.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3D is a partial side sectional view of the showerhead of FIG. 3C, according to one embodiment of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a semiconductor process chamber. More specifically, embodiments of the disclosure relate to a semiconductor process chamber adapted to control the flow and concentration of gases over the surface of the substrate.

Figure 1A:
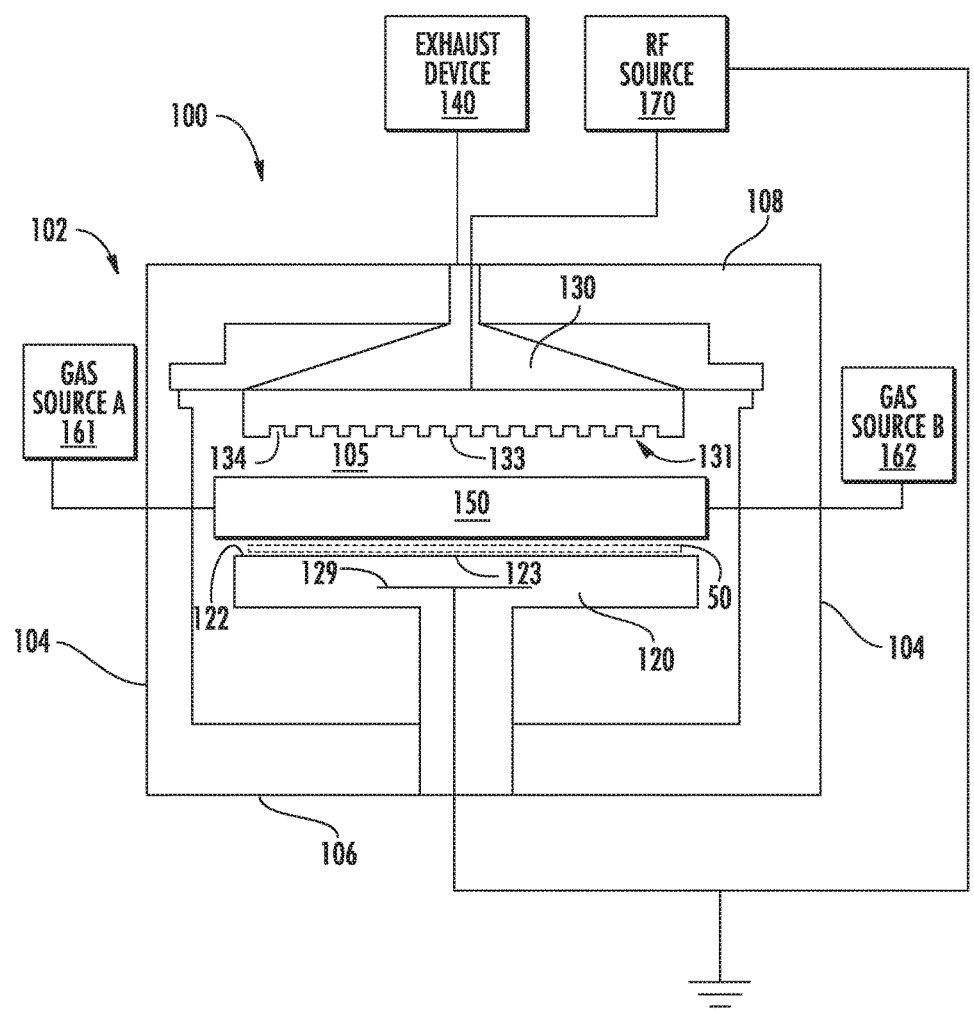
FIG. 1A is a side sectional view of a process chamber, according to one embodiment of the disclosure.
Figure 1B:
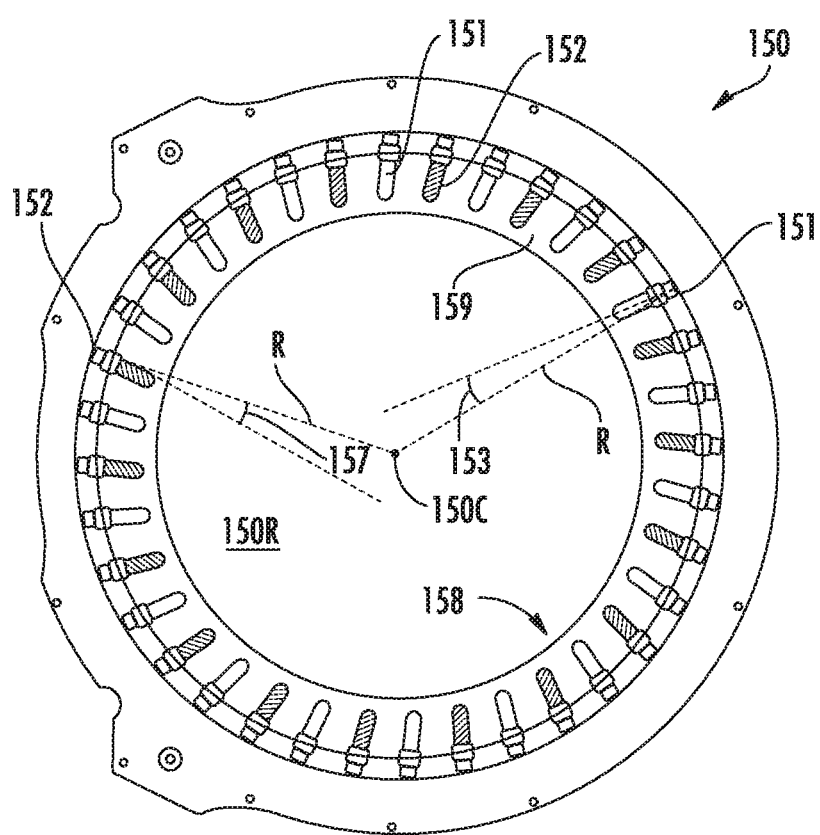
FIG. 1B is a top cross-sectional view of a gas ring to be used in the process chamber of FIG. 1A, according to one embodiment of the disclosure.

FIG. 1A is a side sectional view of a process chamber 100, according to one embodiment of the disclosure. FIG. 1B is a top cross-sectional view of a gas ring 150 to be used in the process chamber 100. As illustrated in FIG. 1B, the plurality of first nozzles 151, which are described below, may be machined into the gas ring 150, as are illustrated in FIG. 1B. The process chamber 100 includes a chamber body 102 having one or more side walls 104, a bottom 106, and a top 108 disposed on the side walls 104. The side walls 104, bottom 106, and top 108 define an interior region 105 of the process chamber 100.

The process chamber 100 includes a substrate support 120 and an exhaust vent 130 disposed above the substrate support 120. A processing region is formed between the exhaust vent 130 and the substrate support 120. The substrate support 120 can be used to support a substrate 50 during a deposition process performed in the process chamber 100. The exhaust vent 130 can be used to remove gases, such as process gases, from the process chamber 100. The substrate support 120 includes a substrate supporting surface 122 having a center 123. The exhaust vent 130 has an exhaust inlet 131 facing the substrate supporting surface 122. The exhaust inlet 131 may include a plurality of passages 134 that extend through the exhaust vent 130 forming part of the exhaust path for the gases that are removed from the interior region 105 of the process chamber 100. The passages 134 may take the form of rings disposed across the exhaust inlet 131, such as rings disposed at different radial locations across the exhaust inlet 131. In other embodiments, the passages 134 may take the form of a plurality of orifices arranged across the exhaust inlet 131, such as a regular array of orifices in a plate. The exhaust vent 130 can overlie the center 123 of the substrate supporting surface 122. For example, a center 133 of the exhaust inlet 131 may overlie the center 123 of the substrate supporting surface 122. In some embodiments, the exhaust inlet 131 overlies most of the substrate supporting surface 122. In other embodiments, the exhaust inlet 131 overlies all of the substrate supporting surface 122.

The process chamber 100 further includes the gas ring 150 disposed at a vertical location between the substrate support 120 and the exhaust vent 130. The gas ring 150 includes an annular shaped body 158 having an inner surface 159 that circumscribes an annular region 150R. The gas ring 150 includes a plurality of first nozzles 151 coupled to a first gas source 161 and configured to deliver a first gas from the first gas source 161 to the interior region 105. The plurality of first nozzles 151 are formed in the annular shaped body 158 in a first circular array. The first gas, delivered from the first gas source 161, may be an oxidizer, such as $H_2O$ or $NH_3$. The gas ring 150 further includes a plurality of second nozzles 152 coupled to a second gas source 162 that are configured to deliver a second gas to the interior region 105. The plurality of second nozzles 152 are formed in the annular shaped body 158 in a second circular array. The second gas, delivered from the second gas source 162, may be a deposition gas precursor, such as pentakis(dimethylamino) tantalum (PDMAT) or tetrakis-ethyl-methylamino hafnium (TEMAHf). The first circular array of first nozzles 151 and the second circular array of second nozzles 152 may be arranged in an alternating pattern around the gas ring 150.

Although many of the components described herein, such as the gas ring 150, are described having a circular geometry, other ring-shaped geometries are also contemplated, such as a polygon-shaped ring, an oval ring, or a ring having an irregular shape.

Each first nozzle 151 can directed at a first radial angle 153, wherein the first radial angle 153 is offset from a radius R extending from a center 150C of the annular region 150R of the gas ring 150 by about 0.3 degrees to about 30 degrees, such as by about 0.5 degrees to about 15 degrees. Each second nozzle 152 can directed at a second radial angle 157, wherein the second radial angle 157 is offset from a radius R extending from a center 150C of the annular region 150R of the gas ring 150 by about 0.3 degrees to about 30 degrees, such as by about 0.5 degrees to about 15 degrees. By aligning the nozzles 151, 152 at the respective radial angles 153, 157 a swirling motion of the process gases in a horizontal plane above the substrate 50 may be achieved. The swirling motion of the process gases can begin around the outer edges of the substrate 50 and then continue inwardly towards regions above the center of the substrate 50. As the process gases swirl inwardly towards regions above the center of the substrate 50, the exhaust vent 130 draws some of the process gases towards the exhaust vent 130 and out of the interior region 105, as is discussed below.

The exhaust vent 130 is coupled to an exhaust device 140, such as a vacuum pump. The exhaust device 140 may be configured to create a low pressure at the exhaust vent 130 relative to the processing region to remove process gases from the interior region 105 of the process chamber 100. The exhaust inlet 131 and/or the substrate support 120 can be coupled to an RF source 170. The exhaust inlet 131 may be formed of a metallic material to which the RF source 170 is coupled. The substrate support 120 may include an electrode 129 that is disposed within the substrate support 120 to which the RF source 170 is coupled. In some embodiments, the exhaust inlet 131 is coupled to a power terminal of the RF source 170 and the electrode in the substrate support 120 is in communication with a ground terminal of the RF source 170. The RF source 170 may generate to a radio frequency, such as 13.56 MHz or 40 MHz. The RF source 170 can be coupled to the exhaust inlet 131 and the substrate support 120, and the RF source 170 can be used to form a plasma that contains the precursor and oxidizer gases in the process chamber 100 during processing. In some embodiments, a DC bias is also applied to an electrode (not shown) that is disposed within the substrate support 120, so that the substrate support 120 can serve as an electrostatic chuck. Furthermore, in some embodiments, the first gas source 161 and/or the second gas source 162 can include a remote plasma source that is disposed between a gas delivery source (e.g., gas bottle, ampoule, gas source, etc.) and the gas ring 150. The precursor and the oxidizer may also be supplied to a remote plasma source together before being supplied to the process chamber 100.

Figure 1C:
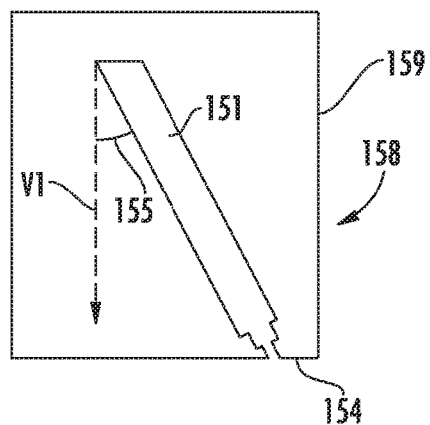
FIG. 1C is a close-up side sectional view of a first gas nozzle in the gas ring of FIG. 1B, according to one embodiment of the disclosure.
Figure 1D:
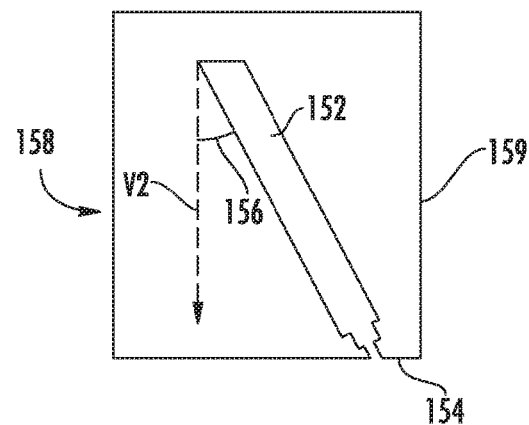
FIG. 1D is a close-up side sectional view of a second gas nozzle in the gas ring of FIG. 1B, according to one embodiment of the disclosure.

FIG. 1C is a close-up side sectional view showing an orientation of a first gas nozzle 151 in the annular shaped body 158 of the gas ring 150, according to one embodiment of the disclosure. FIG. 1D is a close-up side sectional view of a second gas nozzle 152 in the annular shaped body 158 of the gas ring 150, according to one embodiment of the disclosure. The first nozzle 151 may be directed at a first angle 155. The first angle 155 can be offset from a downward vertical direction illustrated by the downward vertical line V1 by about 0 degrees to about 30 degrees, such as about 5 degrees to about 15 degrees. The downward vertical line V1 can be substantially perpendicular to the substrate supporting surface 122 of the substrate support 120. Each second nozzle 152 may be directed at a second angle 156. The second angle 156 is offset from a downward vertical direction illustrated by the downward vertical line V2 by about 0 degrees to about 30 degrees, such as about 5 degrees to about 15 degrees. The downward vertical line V2 can be substantially perpendicular to the substrate supporting surface 122 of the substrate support 120. The first angle 155 and the second angle 156 can be used to mix the oxidizer and precursor above a substrate 50 on the substrate support 120. Although FIGS. 10 and 1D show the first nozzle 151 and the second nozzle 152 having a discharge through the bottom surface 154 of the annular shaped body 158, in some embodiments the first nozzles 151 and the second nozzles 152 may discharge through the inner surface 159.

Figure 1E:
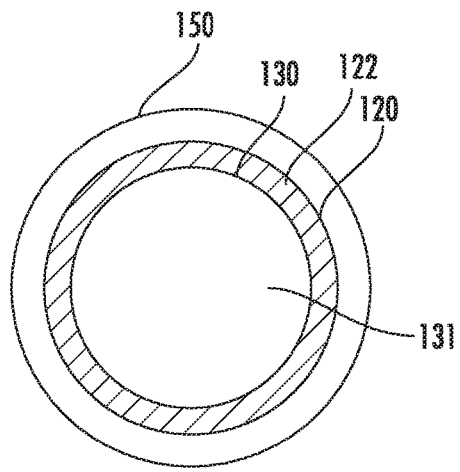
FIG. 1E is a top plan view of different components in the process chamber of FIG. 1A, according to one embodiment of the disclosure.

FIG. 1E is a top plan view of some of the different components in the process chamber 100, according to one embodiment of the disclosure to further illustrate the relative sizes of the gas ring 150, the substrate support 120, and the exhaust vent 130. As shown, the gas ring 150 can surround an area larger than an area of the substrate supporting surface 122. Sizing the gas ring 150 to surround an area larger than the substrate supporting surface 122 can ensure that the process gases are disposed around all of the edges of the substrate 50 on the substrate supporting surface 122. Furthermore, the exhaust inlet 131 can cover an area smaller than an area of the substrate supporting surface 122. Placing the exhaust inlet over the center 123 of the substrate supporting surface 122 and sizing the exhaust inlet 131 to cover an area smaller than the substrate supporting surface 122 can be used to increase the likelihood that the delivered gases will have a longer residence time before being removed from the process chamber 100.

Furthermore, as discussed above, the first radial angle 153 of the first nozzles 151 and the second radial angle 157 of the second nozzles 152 can be used to create a swirling motion of the process gases over the surface of a substrate that is disposed on the substrate supporting surface 122. For example, the process gases may swirl towards areas above the center 123 of the substrate supporting surface 122. Thus, the gases above the center 123 of the substrate supporting surface 122 may have longer residence times than gases closer to the gas ring 150. Conversely, in conventional process chamber designs with exhaust paths disposed outwardly of the substrate support, gases with long residence times that are above the substrate can be much harder to remove from the interior region 105. Gases with long residence times may form undesirable molecules, particles or radicals in a plasma environment, which can result in a less uniform distribution of process gases above the substrate support, which can in turn reduce the quality of the deposited film.

Figure 2A:
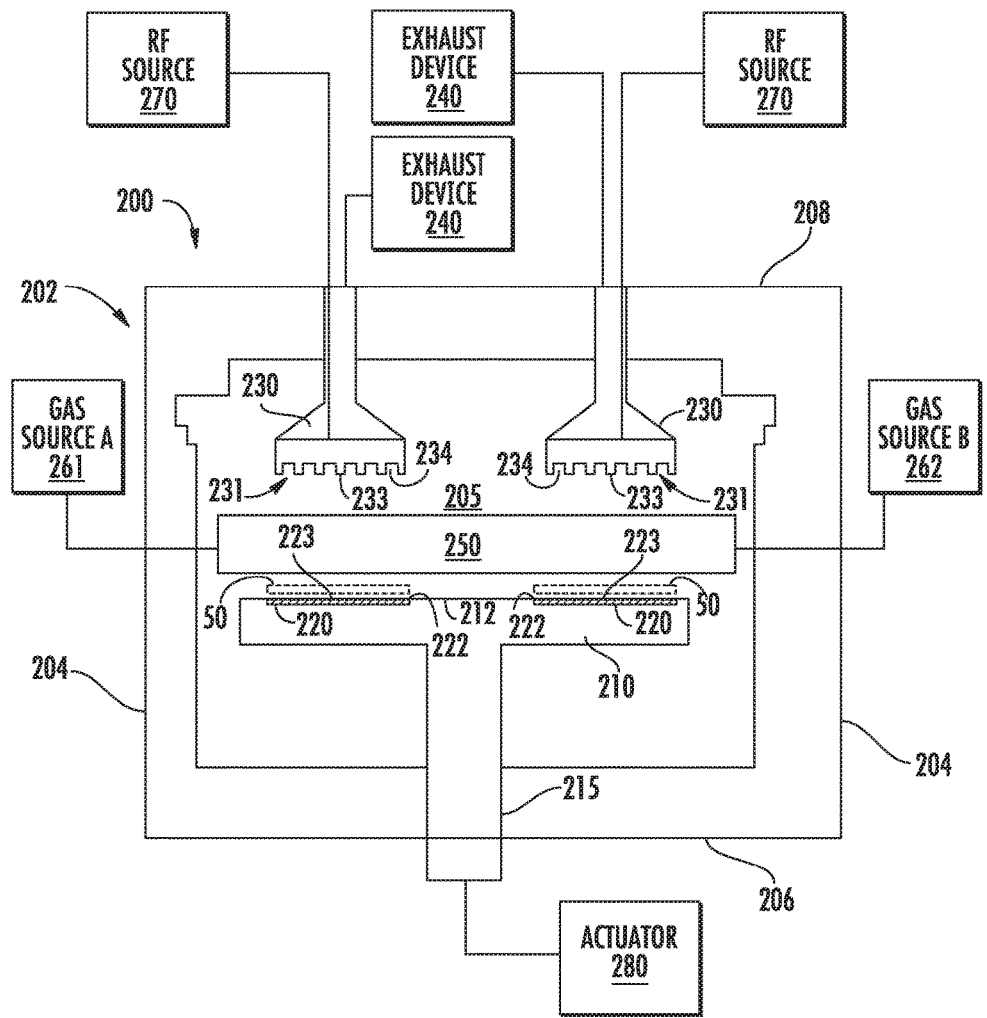
FIG. 2A is a side sectional view of a process chamber, according to one embodiment of the disclosure.
Figure 2B:
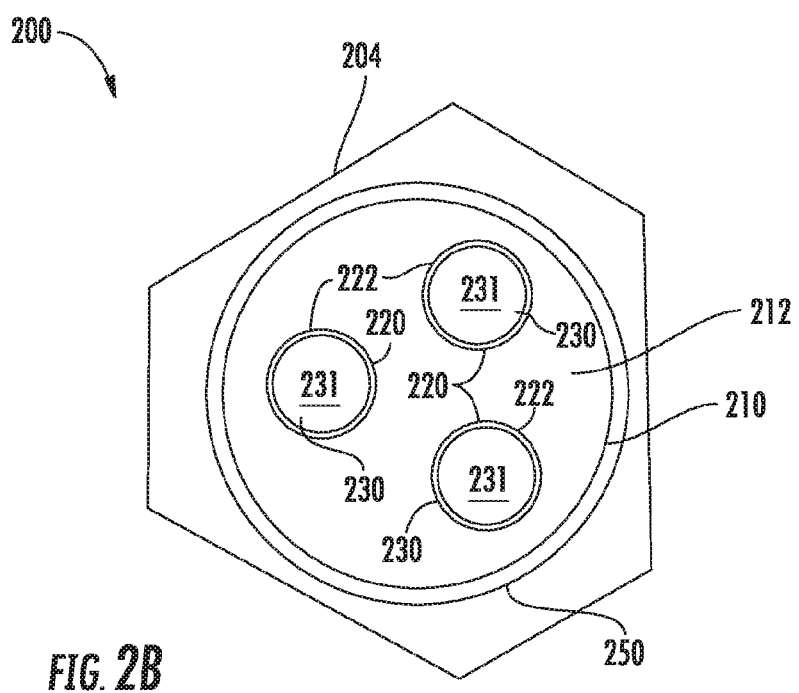
FIG. 2B is a top plan view of a of the process chamber of FIG. 2A, according to one embodiment of the disclosure.

FIG. 2A is a side sectional view of the process chamber 200, according to one embodiment of the disclosure. FIG. 2B is a top plan view of the process chamber 200. The process chamber 200 includes a chamber body 202 having one or more side walls 204, a bottom 206, and a top 208 disposed on the side walls 204. The side walls 204, bottom 206, and top 208 define an interior region 205 of the process chamber 200.

The process chamber 200 includes a substrate support 210 having a top surface 212. The substrate support 210 includes a plurality of substrate holders 220 disposed at different angular locations around the substrate support 210. The substrate support 210 is shown including three substrate holders in FIG. 2B, but more or less may be included. FIG. 2A only shows two substrate holders 220 in order to not clutter the drawing. The third substrate holder 210 may positioned behind one of the substrate holders 220 shown in FIG. 2A and thus is not visible in the side view of FIG. 2A. The substrate holders 220 each include a substrate supporting surface 222 to support a substrate 50 during processing. Each substrate supporting surface 222 has a center 223.

The substrate support 210 can also be rotatable around the interior region 205 of the process chamber 200. For example, a shaft 215 of the substrate support may extend through the bottom 206 of the process chamber 200 with appropriate seals, and the shaft may be coupled to an actuator 280, such as a motor, disposed outside of the process chamber 200. The actuator 280 may be used to rotate the substrate support 210. In some embodiments, the substrate support 210 may be rotated during processing to ensure that each substrate 50 in the process chamber 200 is exposed to the same conditions within the process chamber 200.

The process chamber 200 further includes an exhaust vent 230 disposed above each substrate holder 220. A processing region (e.g., interior region 205) is formed between each exhaust vent 230 and the substrate support 210. The exhaust vent 230 can be used to remove gases, such as process gases, from the process chamber 100. Each exhaust vent 230 can be coupled to an exhaust device 240, such as a vacuum pump. Each exhaust device 240 can be configured to create a low pressure at the exhaust vent 230 relative to the processing region. In some embodiments, each exhaust vent 230 can be coupled to a separate exhaust device 240 to individually tune the exhaust above each substrate holder 220. Alternatively, a single exhaust device 240 may be used for other embodiments of the process chamber 200. Each exhaust vent 230 has an exhaust inlet 231 facing the substrate supporting surface 222 of the respective substrate holder 220. Each exhaust inlet 231 may include a plurality of passages 234 through the exhaust vent 230. The passages 234 may, for example, take the form of rings and/or orifices discussed above in reference to the passages 134 of FIG. 1A.

Each exhaust vent 230 can overlie the center 223 of the respective substrate supporting surface 222. For example, a center 233 of each exhaust inlet 231 may overlie the center 223 of the respective substrate supporting surface 222. In some embodiments, each exhaust inlet 231 overlies a substantial portion of the respective substrate supporting surface 222. In such embodiments, the exhaust inlet 231 covers an area smaller than an area of the respective substrate supporting surface 222, for example as shown in the top view of FIG. 2B. In other embodiments, each exhaust inlet 231 overlies all of the respective substrate supporting surface 222. Although FIG. 2B shows an exhaust vent 230 for each substrate holder, other embodiments may include a single exhaust vent for the process chamber 200. For example, a single exhaust vent may be useful for an embodiment in which the substrate support 210 is rotated about the center and central axis of the substrate support 210 during processing. Using a single exhaust vent in such an embodiment can promote a more uniform exhaust above the rotating substrate support 210 as opposed to individual exhaust vents disposed at different locations above the substrate support 210.

The process chamber 200 further includes a gas ring 250 that is disposed at vertical location between the vertical location of the substrate support 210 and the vertical location of each of the exhaust vents 230. In one embodiment, the gas ring 250 surrounds an area larger than an area of a top surface 212 of the substrate support 210. The gas ring 250 can supply process gases, such as the precursors and oxidizers described above, to the surface of the substrates disposed on the substrate supporting surfaces 222 in the process chamber 200. The gas ring 250 is described in further detail below in reference to FIG. 2C.

In some embodiments, each exhaust inlet 231 and each substrate holder 220 can be coupled to an RF source 270. Each exhaust inlet 231 may be formed of a metallic material to which the RF source 270 is coupled. Each substrate holder 220 may include an embedded electrode (not shown) to which the RF source 270 is coupled. The RF source 270 may generate to a radio frequency, such as 13.56 MHz or 40 MHz that can be coupled to the exhaust inlet 231 and the electrode in the substrate holder 220 and be used to form a plasma of the precursor and oxidizer in the process chamber 200. In some embodiments, the exhaust inlet 231 is coupled to a power terminal (not shown) of the RF source 270 and the electrode in the substrate holder 220 is coupled to a ground terminal (not shown) of the RF source 270. In some embodiments, a DC bias is also applied to the electrode (not shown) embedded in the substrate holders 220, so that the substrate holders 220 can each serve as an electrostatic chuck. Furthermore, in some embodiments, the first gas source 261 and/or the second gas source 262 can include a remote plasma source that is disposed between a gas delivery source (e.g., gas bottle, ampoule, gas source, etc.) and the gas ring 250. The precursor and the oxidizer may also be supplied to a remote plasma source together before being supplied to the process chamber 200.

Figure 2C:
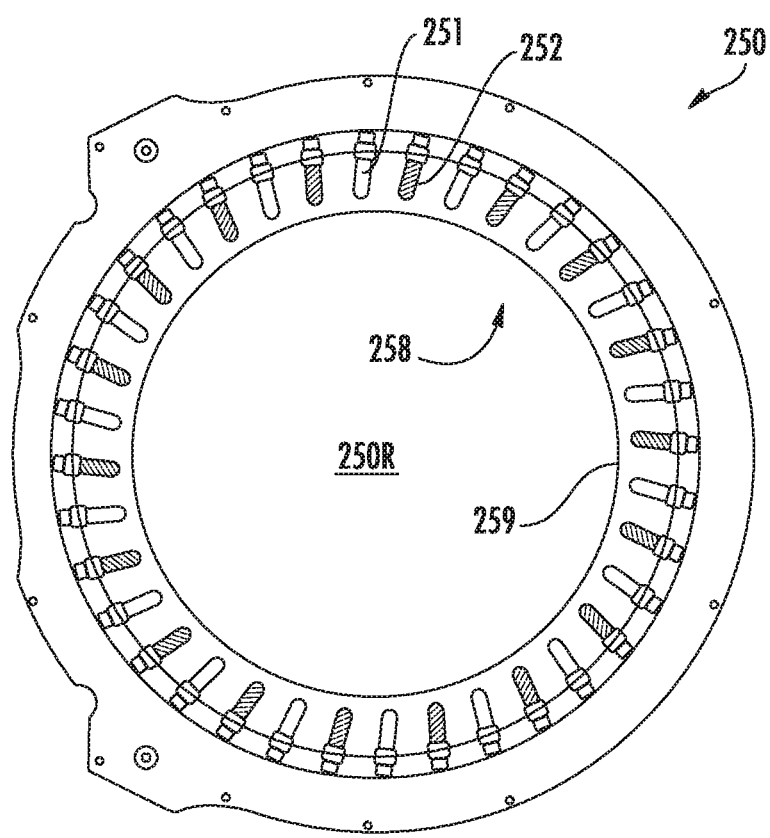
FIG. 2C is a top cross-sectional view of a gas ring to be used in the process chamber of FIGS. 2A and 2B, according to one embodiment of the disclosure.

FIG. 2C is a top sectional view of the gas ring 250 to be used in the process chamber 200. In some embodiments, the gas ring 250 may be substantially similar in design to the gas ring 150 discussed above. The gas ring 250 includes an annular shaped body 258 having an inner surface 259 that circumscribes an annular region 250R. The gas ring 250 further includes a plurality of first nozzles 251 that are coupled a first gas source 261 and configured to deliver a first gas to the processing region. The plurality of first nozzles 251 are formed in the annular shaped body 258 in a first circular array. The gas ring 250 further includes a plurality of second nozzles 252 that are coupled to a second gas source 262 and configured to deliver a second gas to the processing region. The plurality of second nozzles 252 are formed in the annular shaped body 258 in a second circular array. The first circular array of first nozzles 251 and the second circular array of second nozzles 252 can be arranged in an alternating pattern around the gas ring 250. Furthermore, the first nozzles 251 and the second nozzles 252 may be oriented similar to the nozzles 151, 152 discussed above in reference to FIG. 1C and the angles 155, 156 and the radial angles 153, 157.

Figure 2D:
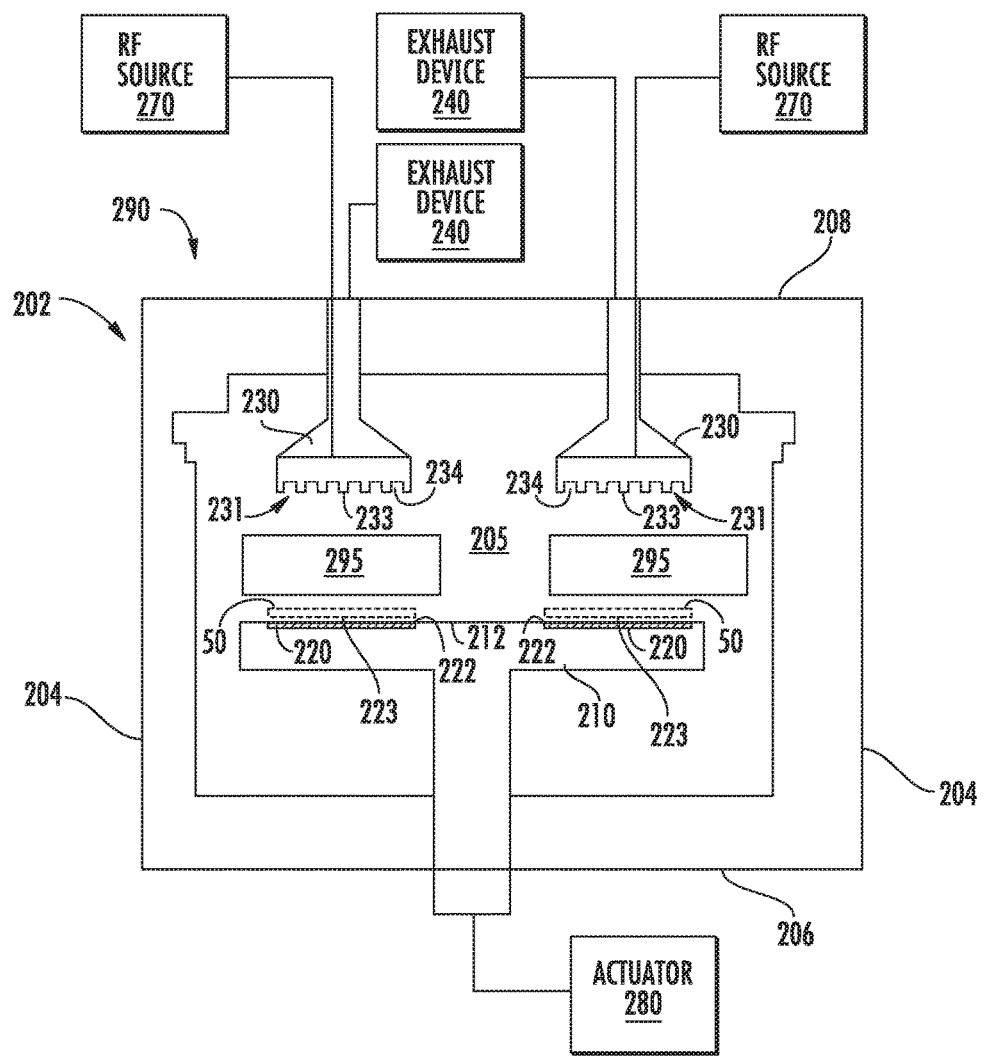
FIG. 2D is a side sectional view of a process chamber, according to one embodiment of the disclosure.
Figure 2E:
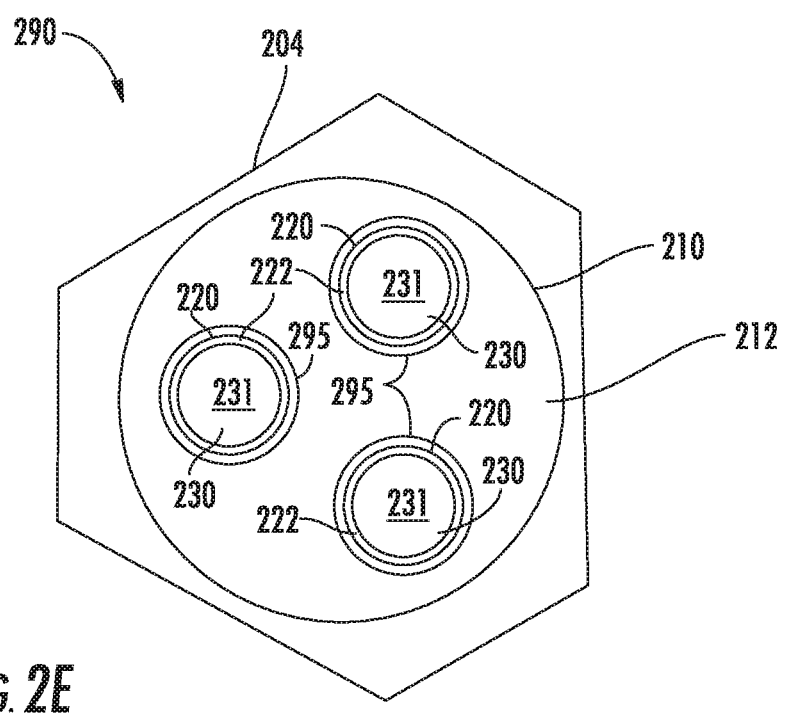
FIG. 2E is a top plan view of a of the process chamber of FIG. 2D, according to one embodiment of the disclosure.

FIG. 2D is a side sectional view of a process chamber 290, according to one embodiment of the disclosure. FIG. 2E is a top plan view of the process chamber 290 of FIG. 2D. The process chamber 290 is similar to the process chamber 200 of FIGS. 2A and 2B except that the process chamber 290 includes a gas ring 295 that is positioned to surround and/or partially enclose an interior region that is formed between each substrate holder 220 and the exhaust vents 230, instead of the single gas ring 250 design discussed above in conjunction with the process chamber 200. FIG. 2D is shown without the connections to the first gas source 261 and the second gas source 262 in order to not clutter the drawing, but each of the plurality of gas sources, such as first gas source 261 and the second gas source 262, may be coupled to each gas ring 295.

The gas ring 295 may be a scaled down version of the gas ring 250 including a plurality of first nozzles and a plurality of second nozzles in an annular shaped body. In some embodiments, there may be less nozzles in the gas ring 295 than in the gas ring 250 due to the smaller annular region that the gas ring 295 encloses relative to the gas ring 250. In some embodiments, the gas ring 150 of the process chamber 100, which illustrated in FIGS. 1A-1E, may be used for each of the gas rings 295 of the process chamber 290.

In the process chamber 290, each exhaust vent 230 can overlie the center 223 of the respective substrate supporting surface 222. For example, a center 233 of each exhaust inlet 231 may overlie the center 223 of the respective substrate supporting surface 222. In some embodiments, each exhaust inlet 231 overlies a substantial portion of the respective substrate supporting surface 222. In such embodiments, the exhaust inlet 231 covers an area smaller than an area of the respective substrate supporting surface 222, for example as shown in the top view of FIG. 2E. In other embodiments, each exhaust inlet 231 overlies all of the respective substrate supporting surface 222. The gas ring 295 can surround an area larger than an area of the substrate supporting surface 222. Sizing the gas ring 295 to surround an area larger than the substrate supporting surface 222 can ensure that the process gases are disposed around all of the edges of the substrate 50 on the substrate supporting surface 222. By placing a separate gas ring 295 above each substrate holder 220, allows for individual control of the flow of process gases above each of the substrate holders 220. Furthermore, use of the separate gas rings 295 and the exhaust vent 230 above the substrate holder can reduce the amount of process gases present in areas of the process chamber 290 that are not overlying the substrate holder 220. Reducing the amount of process gases in areas not overlying the substrate holders 220 can reduce unwanted deposition on chamber components, such as the side wall(s) 204 of the process chamber 290 or any protective liners that are frequently used in process chambers. Reducing the occurrences of these undesirable depositions can reduce the frequency and/or duration of cleaning procedures for the process chamber 290, which can increase machine uptime and overall production for the process chamber 290.

Figure 3A:
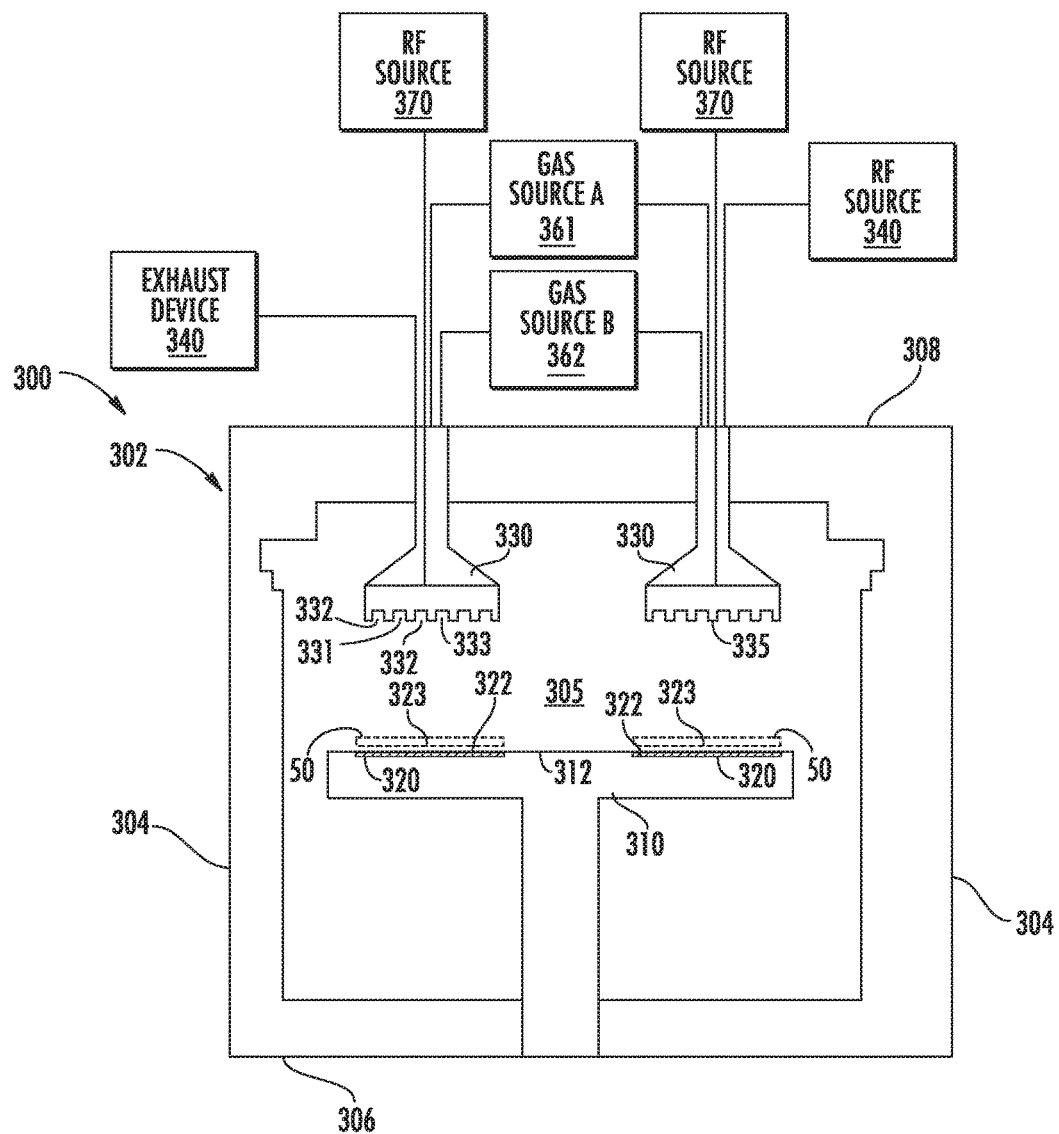
FIG. 3A is a side sectional view of a process chamber, according to one embodiment of the disclosure.
Figure 3B:
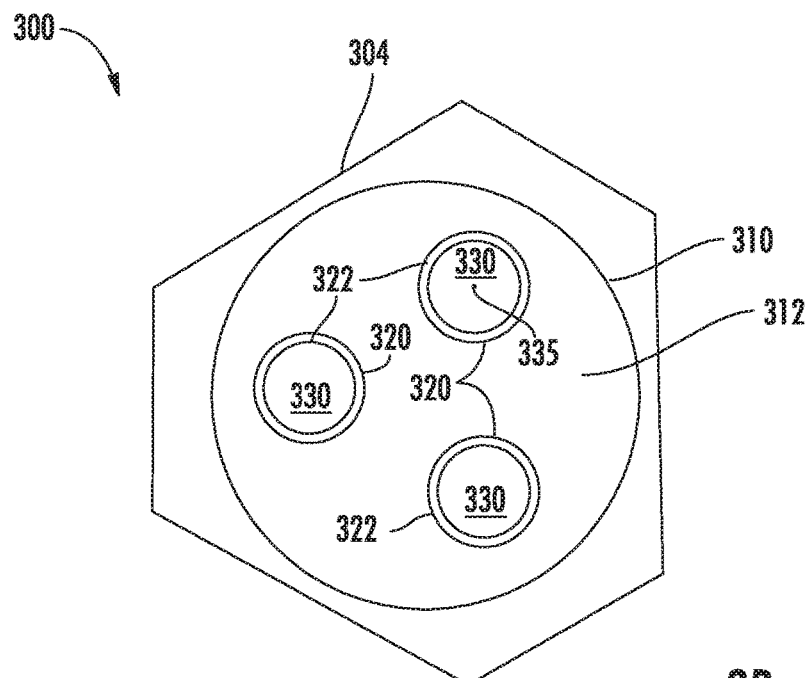
FIG. 3B is a top plan view of the process chamber of FIG. 3A, according to one embodiment of the disclosure.
Figure 3C:
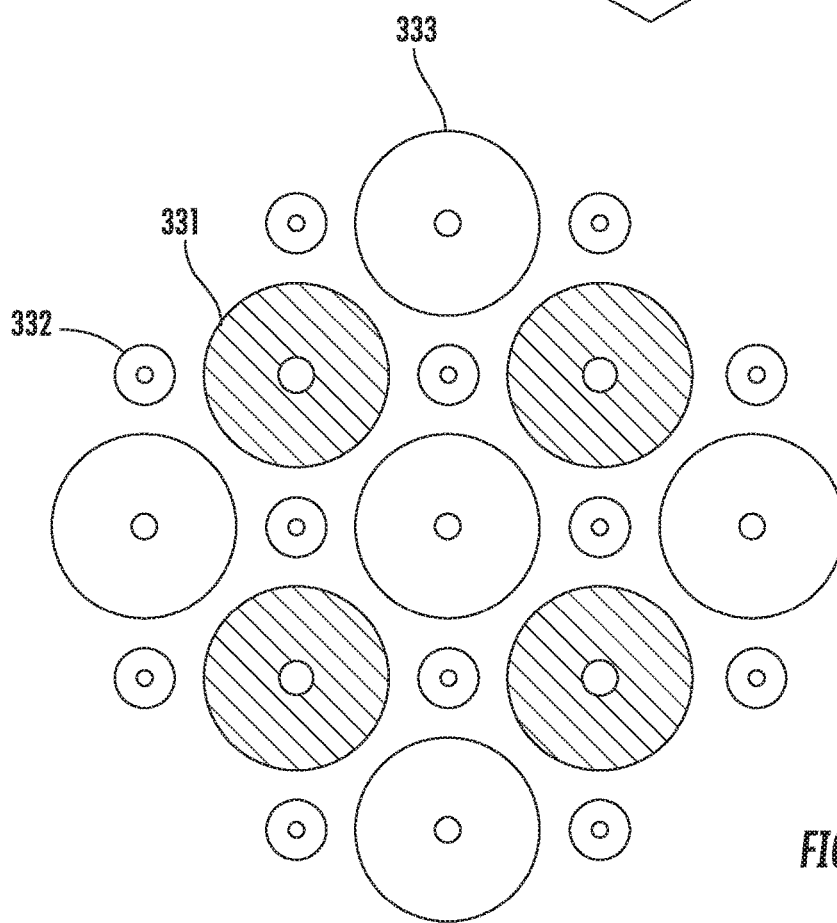
FIG. 3C is a partial bottom view of a showerhead to be used in the process chamber of FIG. 3A, according to one embodiment of the disclosure.

FIG. 3A is a side cross-sectional view of a process chamber 300, according to one embodiment of the disclosure. FIG. 3B is a top plan view of the process chamber 300. FIG. 3C is a bottom partial view of a showerhead 330 to be used in the process chamber 300. FIG. 3D is a partial side sectional view of the showerhead 330 of FIG. 3C.

The process chamber 300 includes a chamber body 302 having one or more side walls 304, a bottom 306, and a top 308 disposed on the side walls 304. The side walls 304, bottom 306, and top 308 define an interior region 305 of the process chamber 300.

The process chamber 300 includes a substrate support 310 having a top surface 312. The substrate support 310 includes a plurality of substrate holders 320 disposed at different angular locations around the substrate support 310. The substrate support 310 is shown including three substrate holders in FIG. 3B, but more or less may be included. FIG. 3A only shows two substrate holders 220 in order to not clutter the drawing. The third substrate holder 320 may positioned behind one of the substrate holders 320 shown in FIG. 3A and thus is not visible in the side view of FIG. 3A. The substrate holders 320 each include a substrate supporting surface 322 to support a substrate 50 during processing. Each substrate supporting surface 322 has a center 323. The substrate support 310 can be rotatable around the interior region 305 of the process chamber 300 similarly to how rotation of the substrate support 210 of FIG. 2A described above.

The process chamber 300 further includes a showerhead 330 disposed above each substrate holder 320. A separate processing region is formed between each showerhead 330 and the substrate support 310. Each showerhead 330 includes a plurality of first orifices 331 coupled to a first gas source 361. The first gas source 361 may be an oxidizer, such as $H_2O$ or $NH_3$. Each showerhead 330 further includes a plurality of second orifices 332 coupled to a second gas source 362. The second gas source 362 may be a precursor, such as pentakis(dimethylamino) tantalum (PDMAT) or tetrakis-ethyl-methylamino hafnium (TEMAHf). In some embodiments, four or more second orifices 332 are disposed around each first orifice 331. For example, FIG. 3C shows four second orifices 332 arranged in a square pattern around each first orifice 331. FIG. 3D shows a side cross-sectional view of the arrangement of orifices shown in FIG. 3C. In other embodiments, the second orifices 332 may be arranged in other patterns around the first orifices 331. For example, six second orifices 332 may be arranged in a hexagonal pattern around each first orifice 331.

Each showerhead 330 further includes a plurality of third orifices 333 coupled to an exhaust device 340, such as a vacuum pump. The exhaust device 340 can be configured to create a low pressure at the plurality of third orifices 333 of the respective showerhead 330 relative to the processing region. As shown in FIG. 3D, the plurality of third orifices may be coupled to a common plenum 338, and the plenum 338 may be coupled to the exhaust device 340. The larger space of the plenum 338 relative to the channels that lead to the third orifices 333 enables a uniform pressure to be created across the plenum 338, such as across different radial and angular locations across the plenum. Thus, use of the plenum 338 can enable a more uniform flow of gases through each of the third orifices 333, since pressure differentials within or throughout the plenum 338 will be small or non-existent due to the geometric size or volume of the plenum 338 relative to the size of each of the third orifices 333. The plenum 338 design will thus create a gas flow through the third orifices 333 that is uniform across the showerhead 330, since the third orifices 333 all have a similar length through the showerhead 330 and the pressure at the interface between all of the third orifices 333 and plenum 338 will be relatively the same. The uniform gas flow through the plurality of third orifices 333 enables a more uniform exhaust of the gases above the substrate, which can improve product quality. In some embodiments, four or more second orifices 332 are disposed around each third orifice 333. For example, FIG. 3C shows four second orifices 332 arranged in a square pattern around each third orifice 333. In other embodiments, the second orifices 332 may be arranged in other patterns around the third orifices 333. For example, six second orifices 332 may be arranged in a hexagonal pattern around each third orifice 333.

Each showerhead 330 can overlie the center 323 of the respective substrate supporting surface 322. For example, a center 335 of each showerhead 330 may overlie the center 323 of the respective substrate supporting surface 322. In some embodiments, each showerhead 330 overlies most of the respective substrate supporting surface 322. In such embodiments, the showerhead 330 covers an area smaller than an area of the respective substrate supporting surface 322, for example as shown in the top view of FIG. 3B. In other embodiments, each showerhead 330 overlies all of the respective substrate supporting surface 322. Although FIG. 3B shows a showerhead 330 for each substrate holder 320, other embodiments may include a single showerhead for the process chamber 300. For example, a single exhaust vent may be useful for an embodiment in which the substrate support 310 is rotated during processing, for example by using an actuator similar to actuator 280 described above. Using a single exhaust vent in such an embodiment can promote a more uniform exhaust above the rotating substrate support as opposed to individual exhaust vents disposed at different locations above the substrate support 310.

In some embodiments, each exhaust showerhead 330 and each substrate holder 320 can be coupled to an RF source 370. Each showerhead 330 may be formed of a metallic material to which the RF source 370 is coupled. Each substrate holder 320 may include an electrode (not shown) to which the RF source 370 is coupled. The RF source 370 may generate to a radio frequency, such as 13.56 MHz or 40 MHz that can be coupled to the showerhead 330 and the electrode (not shown) in the substrate holder 320 and be used to form a plasma that contains the precursor and oxidizer gases in the process chamber 300. In some embodiments, the showerhead 330 is coupled to a power terminal of the RF source 370 and the electrode in the substrate holder 320 is coupled to a ground terminal of the RF source 370. In some embodiments, a DC bias is also applied to the electrode (not shown) in the substrate holders 320, so that the substrate holders 320 can each serve as an electrostatic chuck. Furthermore, in some embodiments, the first gas source 361 and/or the second gas source 362 can include a remote plasma source that is disposed between a gas delivery source (e.g., gas bottle, ampoule, gas source, etc.) and the showerheads 330. The precursor and the oxidizer may also be supplied to a remote plasma source together before being supplied to the process chamber 300.

Figure 4:
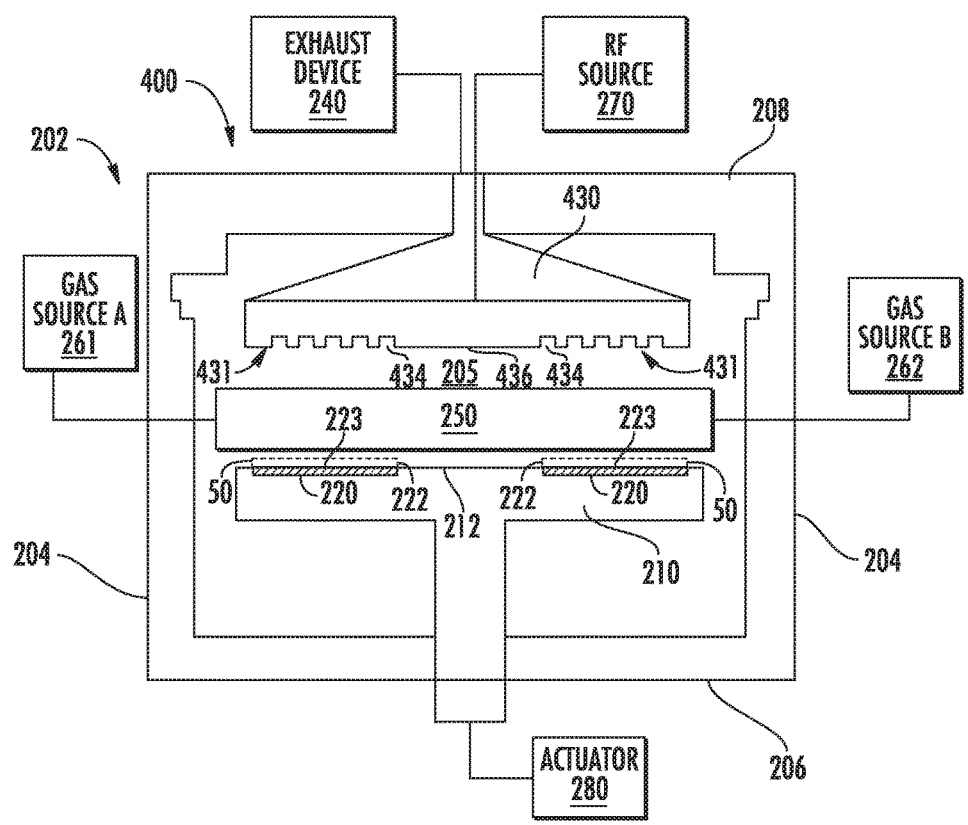
FIG. 4 is a side sectional view of a process chamber, according to one embodiment of the disclosure.

FIG. 4 is a side sectional view of a process chamber 400, according to one embodiment of the disclosure. The process chamber 400 is similar to the process chamber 200 of FIGS. 2A through 2C except that the process chamber 400 includes a single exhaust vent 430 above all of the substrate holders 220 instead of the separate exhaust vents 230 disposed above the substrate holders 220 discussed above in conjunction with the process chamber 200.

The exhaust vent 430 can be used to remove gases, such as process gases, from the process chamber 400. The exhaust vent 430 can be coupled to the exhaust device 240, which can be a vacuum pump. The exhaust device 240 can be configured to create a low pressure at the exhaust vent 430 relative to the processing region between the exhaust vent 430 and the substrate support 210. The exhaust vent 230 has an exhaust inlet 431 facing the substrate supporting surface 222 of the respective substrate holders 220. The exhaust inlet 431 may include a plurality of passages 434 through the exhaust vent 430. The passages 434 may, for example, take the form of rings and/or orifices discussed above in reference to the passages 134 of FIG. 1A. The exhaust inlet 431 may include a central portion 436 that does not include passages. The central portion 436 is positioned over areas of the substrate support 210 that do not include the substrate holders 220. The position of the central portion 436 allows the low pressure generated at the passages 434 to retain the process gases above the substrate holders 220 allowing enhanced control of gases above the substrates 50 during processing.

Figure 5:
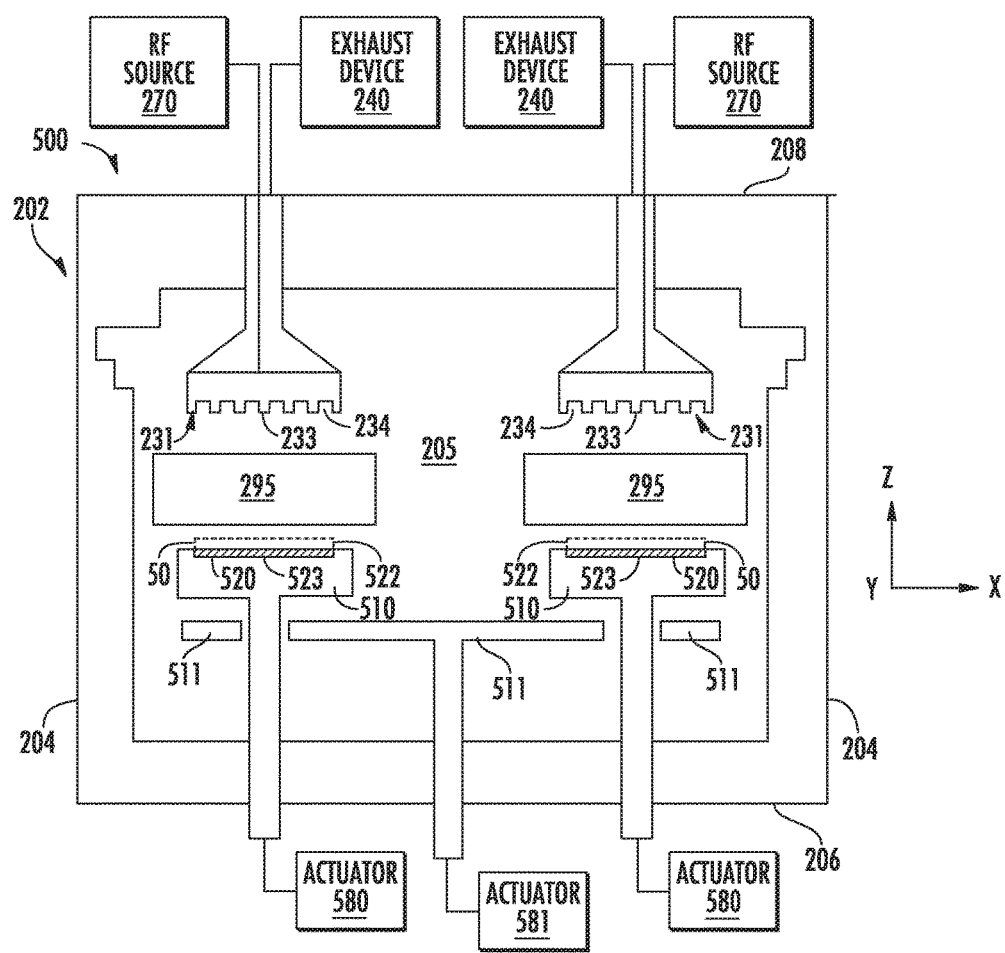
FIG. 5 is a side sectional view of a process chamber, according to one embodiment of the disclosure.

FIG. 5 is a side sectional view of a process chamber 500, according to one embodiment of the disclosure. The process chamber 500 is similar to the process chamber 290 of FIGS. 2D and 2E except that the process chamber 500 includes a separate substrate support 510 for each substrate holder 520. The process chamber 500 can also include a substrate lift device 511 that can be used to remove the substrates 50 from the individual substrate supports 510. The substrate lift device 511 can be coupled to an actuator 581 to provide the vertical motion of the substrate lift device 511 during a transfer of a substrate 50 to or from one of the substrate supports 510. Although not shown in FIG. 5, each substrate 50 can include a plurality of portions that overhang the substrate support 510 allowing for the substrate lift device 511 to transfer the substrate 50 to or from the substrate support 510. The plurality of portions of the substrate 50 that overhang the substrate support 510 are at a different depth in the Y direction of FIG. 5 and thus are not visible in FIG. 5.

Each substrate holder 520 includes a substrate supporting surface 522 for supporting a substrate 50 during processing. Each substrate supporting surface 522 has a center 523. The center 223 of the exhaust inlet 231 can overlie the center of the substrate supporting surface 522. Each of the substrate supports 510 is coupled to an individual actuator 580. Each actuator 580 can rotate and control the speed of rotation of the substrate support 510 that is coupled to that actuator 580. By replacing the single substrate support 210 of process chamber 290 of FIG. 2D with the individual substrate supports 510 of process chamber 500, each substrate 50 can be processed in process chamber 500 with an individual gas ring 295, exhaust vent 230, and substrate support 510 further enhancing the ability to obtain uniform processing across the surface of the substrate 50. Like FIG. 2D, FIG. 5 is shown without the connections to the first gas source 261 and the second gas source 262 shown in FIG. 2A in order to not clutter the drawing, but each of the plurality of gas sources, such as first gas source 261 and the second gas source 262, may be coupled to each gas ring 295.

Each of the embodiments disclosed above provide a process chamber including an exhaust path, such as exhaust vents 130, 230 and showerhead 330, above the substrate supporting surface(s) of the substrate support. The gases in the regions directly above the substrate during processing have a substantial impact on the formation of the films formed on the substrates during processes, such as deposition processes. Placing the exhaust path for process gases at locations other than above the substrate can create the opportunity for undesirable molecules, particles or radicals to remain in the regions above the substrate during processing. Allowing undesirable molecules or radicals to have long residence times above the substrate during processing can reduce the quality of the deposited film. Placing the exhaust path, such as exhaust vents 130, 230 and showerhead 330, above the substrate supporting surface(s) of the substrate support allows these undesirable molecules or radicals to be removed from the region above the substrate during processing. Removal of these molecules or radicals from the regions above the substrate allows for a more uniform gas distribution to be maintained above the surface of the substrate during processing and for consistent and successful product results to be obtained. Furthermore, the process chambers 200, 290, and 300 provide examples of how throughput can be increased with designs that allow for the simultaneous processing of multiple substrates while also providing the advantages of an exhaust path disposed above the substrate during processing as described above.

Additionally, the exhaust vents 130, 230, and the third orifices 333 of the showerhead 330 enable a uniform removal of gases above the substrate supporting surface(s). Placing these exhaust vents and orifices directly above the substrate supporting surface enhances the control of the processing environment over the substrate. The uniform removal of gases can improve the quality of the deposited film and control the amount of unwanted deposition on the supporting process chamber components (e.g., process shields, chamber walls).

Furthermore, embodiments using a gas ring (e.g., gas ring 150) that surrounds an area above the substrate supporting surface and an exhaust vent (e.g., exhaust vent 130) can substantially reduce unwanted deposition on chamber components, such as sidewalls and protective liners that are often used in process chambers. For example, process chambers generally exhaust gases around the perimeter of the process chamber, such as around the chamber walls. In these conventional process chambers, substantial amounts of process gases may contact a variety of chamber components, such as sidewalls or protective liners placed over the sidewalls. Conversely, in this design the process gases are directed inwardly from a gas ring (e.g., gas ring 150) over the substrate supporting surface and then exhausted above the substrate supporting surface, which can substantially reduce the amount of contact between the gases and chamber components disposed outwardly of the gas ring, such as sidewalls or protective liners placed between the sidewalls and the interior of the process chamber. The reduction of these unwanted depositions can reduce the frequency and/or duration of cleaning procedures performed on the process chambers, which can increase machine uptime and overall production for the process chamber of the process chamber. Also, controlling or reducing the amount of unwanted deposits on the supporting process chamber components will reduce particle generation, which can affect device yield, and reduce the process chamber down-time needed to remove coated components and/or clean these unwanted deposits.

Figure 6:
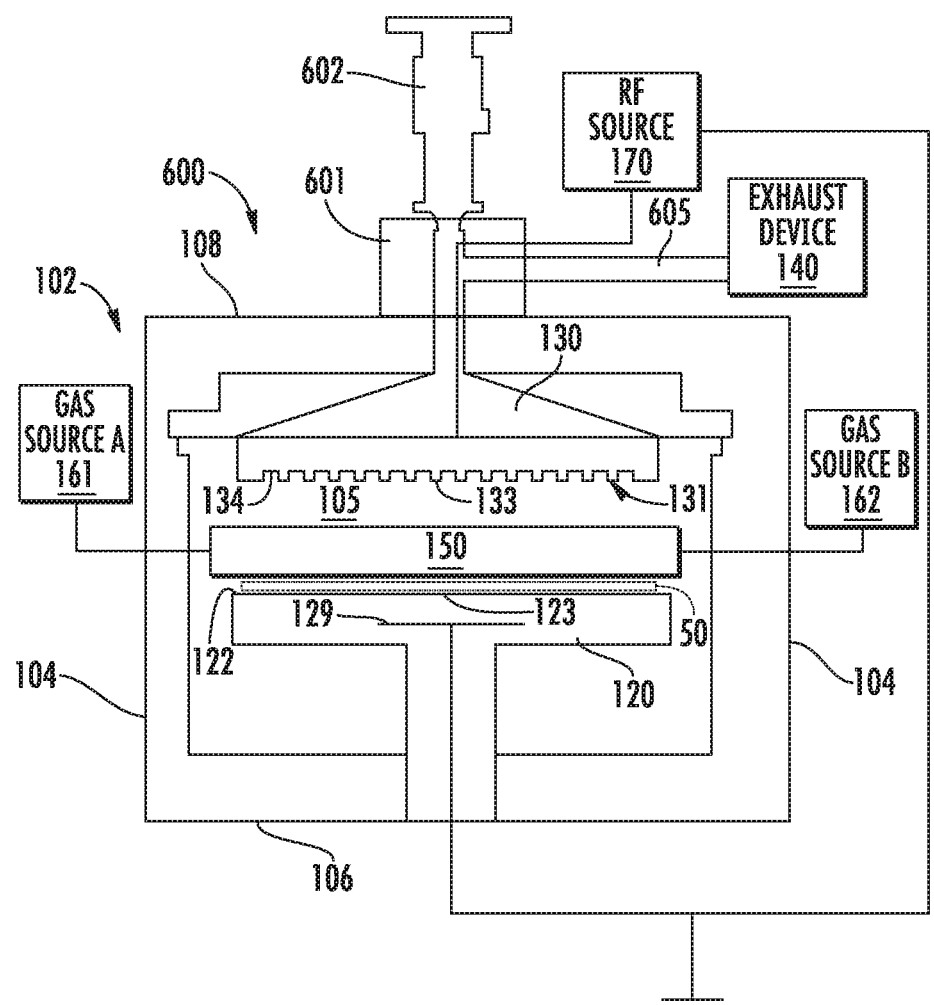
FIG. 6 is a side sectional view of a process chamber, according to another embodiment of the disclosure.

FIG. 6 is a side sectional view of a process chamber 600, according to another embodiment of the disclosure. The process chamber 600 is similar to the process chamber 100 described above except that the process chamber 600 includes a manifold 601 and a remote plasma source 602. The exhaust device 140 can be connected to the manifold 601 through process piping 605. The remote plasma source 602 can be fluidly coupled to the top of the manifold 601. The remote plasma source 602 can be used to provide a plasma to the process chamber 600 during cleaning or other operations. The manifold 601 enables the exhaust vent 130 to be coupled to both the exhaust device 140 and the remote plasma source 602 increasing the functionality of the process chamber 600 relative to other process chambers. Thus, the exhaust vent 130 can be used to exhaust gases from the process chamber 600 and to supply plasma and/or other gases to the process chamber 600.

While the foregoing is directed to embodiments of the present disclosure, other and further embodiments of the disclosure may be devised without departing from the basic scope thereof, and the scope thereof is determined by the claims that follow.

What is claimed is:

1. A process chamber comprising:
   a sidewall;
   a substrate support;
   an exhaust vent disposed over the substrate support, wherein a processing region is formed between the exhaust vent and the substrate support, and the exhaust vent is coupled to an exhaust device configured to create a low pressure at the exhaust vent relative to the processing region;
   a gas ring comprising:
      an annular shaped body having an inner surface that circumscribes an annular region below the exhaust vent;
      a plurality of first nozzles for coupling to a first gas source and configured to deliver a first gas to the processing region, wherein the plurality of first nozzles are formed in the annular shaped body in a first circular array; and
      a plurality of second nozzles for coupling to a second gas source and configured to deliver a second gas to the processing region, wherein the plurality of second nozzles are formed in the annular shaped body in a second circular array.

2. The process chamber of claim 1, wherein the first circular array of first nozzles and the second circular array of second nozzles are arranged in an alternating pattern around the gas ring.

3. The process chamber of claim 2, wherein each first nozzle is directed at a first angle, wherein the first angle is offset from a vertical direction by about 2 degrees to about 30 degrees.

4. The process chamber of claim 3, wherein each second nozzle is directed at a second angle, wherein the second angle is offset from the vertical direction by about 2 degrees to about 30 degrees.

5. The process chamber of claim 1, wherein the substrate support includes a substrate supporting surface having a center and the exhaust vent overlies the center of the substrate supporting surface.

6. The process chamber of claim 5, wherein the exhaust vent has an exhaust inlet facing the substrate supporting surface, wherein the exhaust inlet covers an area smaller than an area of the substrate supporting surface.

7. The process chamber of claim 5, wherein the gas ring surrounds an area larger than an area of the substrate supporting surface.

8. The process chamber of claim 6, wherein the exhaust inlet is coupled to an RF source.

9. The process chamber of claim 1, wherein each first nozzle is directed at a first radial angle, wherein the first radial angle is offset from a radius of the gas ring by about 0.3 degrees to about 30 degrees.

10. A process chamber comprising:
    a sidewall;
    a substrate support including a plurality of substrate holders disposed at different angular locations around the substrate support, the substrate support rotatable around an interior region of the process chamber;
    an exhaust vent disposed above each substrate holder in the process chamber, wherein a processing region is formed between each exhaust vent and the substrate support, and each exhaust vent is coupled to an exhaust device configured to create a low pressure at the exhaust vent relative to the processing region; and
    a gas ring comprising:
       an annular shaped body having an inner surface that circumscribes an annular region;
       a plurality of first nozzles for coupling to a first gas source and configured to deliver a first gas to the processing region, wherein the plurality of first nozzles are formed in the annular shaped body in a first circular array; and
       a plurality of second nozzles for coupling to a second gas source and configured to deliver a second gas to the processing region, wherein the plurality of second nozzles are formed in the annular shaped body in a second circular array.

11. The process chamber of claim 10, wherein the gas ring surrounds an area larger than an area of a top surface of the substrate support.

12. The process chamber of claim 10, wherein the first circular array of first nozzles and the second circular array of second nozzles are arranged in an alternating pattern around the gas ring.

13. The process chamber of claim 10, wherein each first nozzle is directed at a first angle, wherein the first angle is offset from a vertical direction by about 2 degrees to about 30 degrees.

14. The process chamber of claim 13, wherein each second nozzle is directed at a second angle, wherein the second angle is offset from the vertical direction by about 2 degrees to about 30 degrees.

15. The process chamber of claim 10, wherein each exhaust vent has an exhaust inlet facing a substrate supporting surface of one of the substrate holders, wherein the exhaust inlet covers an area smaller than an area of the substrate supporting surface.

16. The process chamber of claim 15, wherein each exhaust inlet is coupled to an RF source.

17. The process chamber of claim 10, wherein each first nozzle is directed at a first radial angle, wherein the first radial angle is offset from a radius of the gas ring by about 0.3 degrees to about 30 degrees.

* * * * *